United States Patent
Watanabe et al.

(10) Patent No.: US 7,993,975 B2
(45) Date of Patent: Aug. 9, 2011

(54) METHOD OF MANUFACTURING SEMICONDUCTOR DEVICE INCLUDING MOUNTING AND DICING CHIPS

(75) Inventors: Mitsuhisa Watanabe, Tokyo (JP); Fumitomo Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 117 days.

(21) Appl. No.: 12/314,895

(22) Filed: Dec. 18, 2008

(65) Prior Publication Data
US 2009/0166863 A1 Jul. 2, 2009

(30) Foreign Application Priority Data
Dec. 27, 2007 (JP) .................. 2007-337091

(51) Int. Cl.
*H01L 21/00* (2006.01)
(52) U.S. Cl. ............... 438/113; 257/620; 257/E21.596; 257/E21.599; 438/68; 438/114; 438/458
(58) Field of Classification Search ............ 438/113
See application file for complete search history.

(56) References Cited

U.S. PATENT DOCUMENTS

| 2002/0039807 A1 | 4/2002 | Koyama |
| 2002/0081771 A1* | 6/2002 | Ding et al. .................. 438/108 |
| 2005/0009245 A1* | 1/2005 | Farnworth .................. 438/127 |
| 2005/0131106 A1* | 6/2005 | Tonapi et al. ............... 523/216 |

FOREIGN PATENT DOCUMENTS

| JP | 09-260536 | 10/1997 |
| JP | 2002-110856 | 4/2002 |
| JP | 2006-216823 | 8/2006 |

OTHER PUBLICATIONS

Daily, James W. Packaging of Electronic Systems—A Mechanical Engineering Approach. McGraw Hill, 1990, pp. 113-115.*

* cited by examiner

*Primary Examiner* — Ajay K Arora
(74) *Attorney, Agent, or Firm* — Foley & Lardner LLP

(57) ABSTRACT

A semiconductor-device manufacturing method includes: forming terminals on a wafer and across each of dicing lines along which the wafer is cut into a plurality of semiconductor chips; preparing a plurality of pre-cut substrates each including a substrate body capable of being cut along corresponding one of cutting lines into a pair of same structured substrate pieces, connection pads provided on a top surface of the substrate body, and external terminals formed on a bottom surface of the substrate body and connected to the connection pads; mounting the pre-cut substrates onto the wafer while the cutting lines of the pre-cut substrates match the dicing lines; and simultaneously dicing the wafer and the pre-cut substrates along the dicing lines matching the cutting lines.

17 Claims, 14 Drawing Sheets

METHOD OF MANUFACTURING SEMICONDUCTOR DEVICE INCLUDING MOUNTING AND DICING CHIPS

BACKGROUND OF THE INVENTION

1. Field of the Invention

The present invention relates to a semiconductor device and a method of manufacturing the same.

Priority is claimed on Japanese Patent Application No. 2007-337091, filed Dec. 27, 2007, the content of which is incorporated herein by reference.

2. Description of the Related Art

Recently, techniques related to semiconductor devices and methods of manufacturing the same have rapidly been progressing, and various techniques have been developed.

For example, Japanese Laid-open Patent, Publication No. H09-260536 discloses a new structure of a semiconductor device. In the structure, a flexible wiring substrate is provided on the bottom surface of a semiconductor chip through an elastomer. Electrode pads provided on the semiconductor chip are electrically connected to lead portions of wirings provided at an opening provided on the wiring substrate. External terminals are provided on the bottom surface of the wiring substrate. A seal made of an insulating resin covers the electrode pads and the lead portions that are in the opening.

However, the electrode pads are connected to the lead portions at the opening provided on the wiring substrate, causing a problem in that the lands are positioned far from the electrode pads. Since the operation speed is becoming faster and faster year after year, reduction in the operation speed might occur if the lands are positioned far from the electrode pads.

Since the opening is provided around the electrode pads, external terminals cannot be arranged therein, and therefore the number of external terminals that can be arranged on the connection region of the wiring substrate and the semiconductor chip is small in some cases.

In this case, external terminals have to be arranged outside the connection region, requiring a larger wiring substrate, and therefore a larger package of a semiconductor device, which is against the recent trend toward thinner and lighter semiconductor devices. Recently, the increasing number of external terminals has been required for semiconductor devices. Therefore, ways to increase the number of external terminals to be arranged on the connection region of the wiring substrate and the semiconductor device have been attracting more and more attention.

Since the semiconductor chip is mounted on the wiring substrate, the wiring substrate has to be larger in size than the semiconductor chip even if all of external terminals can be included inside the area where the semiconductor chip is mounted, requiring a larger package of the semiconductor device, which is also against the recent trend toward thinner and lighter semiconductor devices.

Further, the opening has to be provided on the wiring substrate, and therefore there is a waste region to be cut down, making the wiring substrate larger. If a larger wiring substrate is used, the number of wiring substrates that can be obtained from one original substrate decreases, causing higher costs of forming wiring substrates.

Moreover, the semiconductor chip is mounted on the wiring substrate through the elastomer (elastic member) in the structure so that stress caused by a difference in thermal expansion coefficients between the semiconductor chip and the wiring substrate is reduced, and thereby the reliability of a secondary mounting is enhanced. However, costs of manufacturing the semiconductor device become higher since the elastomer is expensive, and the semiconductor device becomes thicker due to the elastomer, which is also against the recent trend toward thinner and lighter semiconductor devices.

Japanese Laid-open Patent, Publication No. 2002-110856 discloses a method of mounting interposers formed by cutting a wiring substrate into pieces for each element on non-defective semiconductor chips provided on a semiconductor wafer and then cutting the semiconductor wafer into semiconductor chips.

In this method, however, the interposers respectively having substantially the same sizes as those of the semiconductor chips are mounted on the semiconductor chips provided on the semiconductor wafer along dicing lines with no space thereamong. Therefore, the interposers mounted on adjacent semiconductor chips contact each other, and the mounting positions of the interposers might be displaced when electrode pads are aligned on a circumference of each semiconductor chip.

If displacement of the interposers occurs, the cutting precision when the semiconductor wafer is cut into semiconductor chips deteriorates, causing deterioration in the dimensional precision of the semiconductor device.

Further, there is no room for an adhesive to spread, and thereby the adhesive might leak into an adjacent semiconductor chip when the interposers respectively having substantially the same sizes as those of the semiconductor chips are mounted on the semiconductor chips using the adhesive. When the adhesive leaks into the adjacent semiconductor chip, an adjacent interposer cannot precisely be mounted on the adjacent semiconductor chip, and might cover electrode pads on the adjacent semiconductor chip.

Since the interposers respectively having substantially the same sizes as those of the semiconductor chips are mounted on the semiconductor chips, stress caused by a difference in thermal expansion coefficients between the interposers and the semiconductor chips cannot be reduced, decreasing the reliability of a secondary mounting of the semiconductor device. Further, voids might occur between the semiconductor chips and the interposers, causing cracking to occur when the semiconductor device is reflowed. Moreover, the size of each interposer has to be changed according to the size of each semiconductor chip since each interposer is formed for each element.

As another example of semiconductor manufacturing methods, Japanese Laid-open Patent, Publication No. 2006-216823 discloses a method of forming wiring substrates to match semiconductor chips provided on a semiconductor wafer, mounting the wiring substrate on the semiconductor wafer, and collectively cutting the semiconductor wafer and the wiring substrate.

However, grooves are provided on the wiring substrate of the semiconductor device. Therefore, lands are positioned far from electrode pads, causing operation delay as explained above. Further, external terminals need to be aligned on the semiconductor substrate outside the regions where the semiconductor chips are arranged, necessitating a larger package size of the semiconductor device. Moreover, waste regions to be cut down increase. Thereby, the number of wiring substrates that can be obtained from one original substrate decreases, causing higher costs of forming wiring substrates.

When the wiring substrate is collectively mounted on the semiconductor wafer, little displacement on one side of the wiring substrate causes large displacement on the other side thereof, necessitating a precise position setting of the wiring substrate.

Further, a layout of the wiring substrate is determined for each semiconductor wafer, the size and the layout of the wiring substrate need to be changed when the size and the layout of the semiconductor chip is changed.

SUMMARY

In one embodiment, there is provided a method of manufacturing a semiconductor device which may include: forming terminals on a wafer and across each of dicing lines along which the wafer is cut into a plurality of semiconductor chips; preparing a plurality of pre-cut substrates each including a substrate body capable of being cut along corresponding one of cutting lines into a pair of same structured substrate pieces, connection pads provided on a top surface of the substrate body, and external terminals formed on a bottom surface of the substrate body and connected to the connection pads; mounting the pre-cut substrates onto the wafer while the cutting lines of the pre-cut substrates match the dicing lines; and simultaneously dicing the wafer and the pre-cut substrates along the dicing lines matching the cutting lines.

In another embodiment, there is provided a semiconductor device which may include: a semiconductor chip in substantially a rectangular shape; a plurality of terminals provided on a bottom surface of the semiconductor chip along two opposing dicing sides; and a pair of substrates mounted on the semiconductor chip along the dicing sides which match cut sides of the substrates. Each of the substrates may include: a substrate body; a plurality of connection pads provided on a top surface of the substrate body along corresponding one of the cut sides and connected to corresponding terminals of the terminals; and a plurality of external terminals provided on a bottom surface of the substrate body and connected to the connection pads.

As a result, a thinner-and-smaller semiconductor device applicable to various semiconductor chips and a method of efficiently manufacturing the semiconductor device can be provided. Further, operation delay of the semiconductor device can be prevented since the distance between each connection pad and a corresponding external terminal is shortest, making the processing speed of the semiconductor device faster.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated herein for explanatory purpose.

First Embodiment

Hereinafter, a first embodiment of the present invention is explained.

Figure 1:
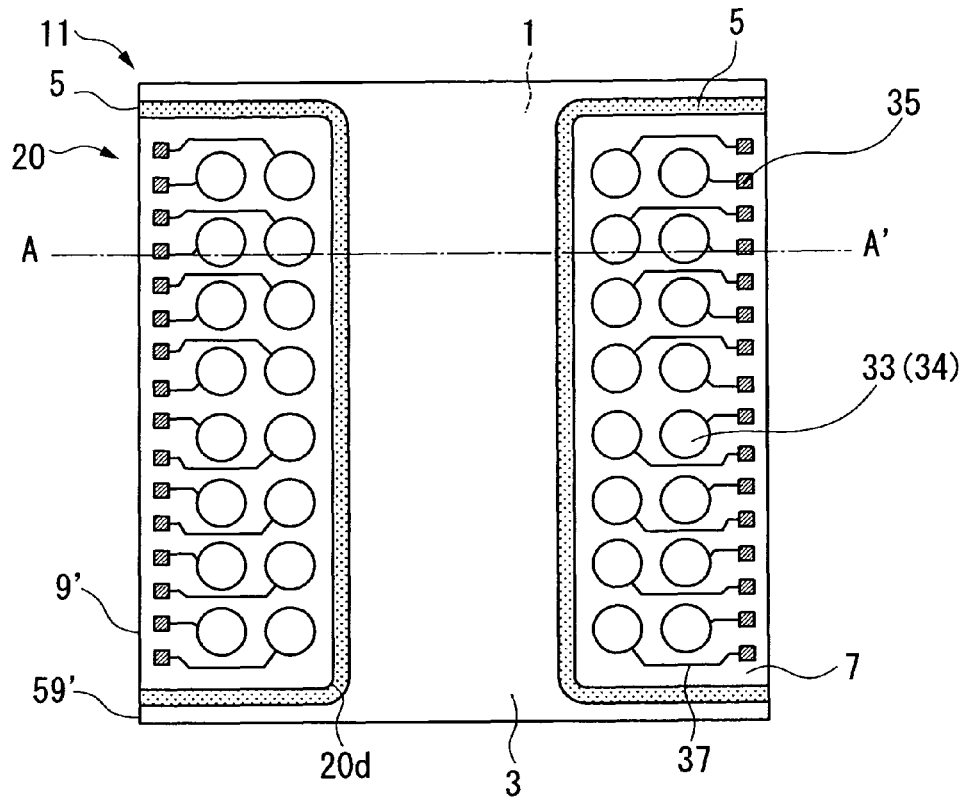
FIG. 1 is a plane view illustrating a semiconductor device according to a first embodiment of the present invention.
Figure 2A:
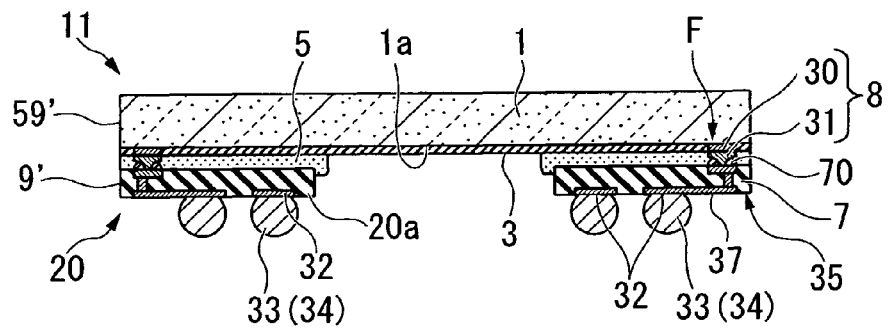
FIG. 2A is a cross-sectional view taken along a line A-A' shown in FIG. 1.
Figure 2B:
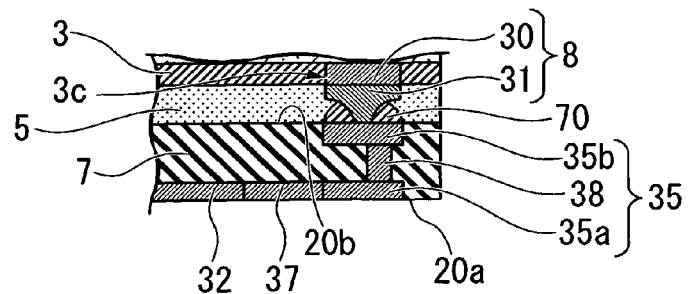
FIG. 2B is a partially enlarged view illustrating a portion F shown in FIG. 2A.

FIG. 1 is a plane view illustrating a semiconductor device 11 according to a first embodiment of the present invention. FIG. 2A is a cross-sectional view taken along a line A-A' shown in FIG. 1. FIG. 2B is a partially enlarged view illustrating a portion F shown in FIG. 2A.

In the semiconductor device 11, wiring substrates 20 in substantially a rectangular shape are connected on the bottom surface 1a of a semiconductor chip 1 in substantially a rectangular shape through underfills 5 as shown in FIG. 1.

The wiring substrates 20 are aligned along opposing two sides that are dicing sides 59' of the semiconductor chip 1 which match cut sides 9' of the wiring substrates 20. Multiple connection pads 35 are aligned on each wiring substrate 20 along the cut side 9'. Multiple external terminals 34 made of ball terminals 33 are aligned in two lines and in parallel with the connection pads 35 on each wiring substrate 20 inside the connection pads 35. The connection pads 35 are electrically connected to the external terminals 34 using wirings 37.

The wiring substrates 20 are formed by cutting pre-cut wiring substrates 19 that will be explained later into pieces along cutting lines 9. Sides of the pieces formed by the cutting become the cut sides 9'.

The semiconductor chip 1 includes a non-depicted semiconductor circuit on a surface of a semiconductor wafer (silicon substrate) formed by a diffusion process, photolithography, and the like. The semiconductor circuit includes a logic circuit, such as a microprocessor, a memory circuit, such as SRAM (static random access memory) or DRAM (dynamic random access memory), or the like.

The size of the semiconductor chip 1 may be, but is not limited to, 10 mm×10 mm. As explained later, electrode pads 30 connected to the semiconductor circuit are provided along the dicing lines 59' on the semiconductor chip 1. As shown in FIGS. 2A and 2B, bump electrodes 31 are respectively provided on the electrode pads, thereby forming terminals 8.

The wiring substrate 20 includes a substrate body 7 in substantially a rectangular shape, connection pads 35, and the external terminals 34 on the substrate body 7. The substrate body 7 of the wiring substrate 20 is preferably a flexible tape substrate which is easy to be processed and can make the semiconductor device lighter and thinner.

The substrate body 7 of the wiring substrate 20 is made of, for example, a polyamide resin of high strength, thermal resistance, and excellent electric insulation. The polyamide resin has the very low linear expansion coefficient, and therefore is nearly a metal. As a result, deformation of the polyamide resin caused by thermal expansion thereof with metal wirings on an electronic circuit hardly occurs when the polyamide resin is used as an insulating material for the electronic circuit, thereby enabling precise wiring processing.

The wiring substrate 20 is preferably smaller than the semiconductor chip 1. For example, the wiring substrate 20 may approximately be, but is not limited to, 2 mm×9 mm with respect to the semiconductor chip 1 of 10 mm×10 mm.

With the use of the wiring substrate 20 that is smaller than the semiconductor chip 1, stress caused by a difference in thermal expansion coefficients can be reduced, and the reliability of a secondary mounting of the semiconductor device 11 can be enhanced. Since the wiring substrate 20 is one of the pieces into which the pre-cut wiring substrate is cut for each group of terminals, stress can be further reduced, and the reliability of a secondary mounting of the semiconductor device 11 can be further enhanced.

In this manner, the semiconductor chip 1 can house the wiring substrates 20, thereby implementing a chip-sized semiconductor device.

Although the wiring substrate 20 shown in FIG. 1 is in substantially a rectangular shape when planarly viewed, the shape of the wiring substrate 20 is not limited thereto, and may be substantially a polygon.

Although the wiring substrate 20 is arranged along the dicing side 59' of the semiconductor chip 1 which matches the cut side 9' when the wiring substrate 20 is planarly viewed, the other three sides thereof are preferably separated from each side of the semiconductor chip 1 by as much as possible.

Specifically, the other three sides of the wiring substrate 20 are preferably separated from each side of the semiconductor chip 1 by more than 50 μm. If the other three sides of the wiring substrate 20 are separated from each side of the semiconductor chip 1 by less than 50 μm, the wiring substrate 20 might be scratched by a part of a manufacturing apparatus in a manufacturing process, and therefore removed from the semiconductor chip 1.

The wiring substrate 20 has chamfered edges 20d as shown in FIG. 1, preventing the wiring substrate 20 from being scratched by a manufacturing apparatus and removed from the semiconductor chip 1 in a manufacturing process.

Although not shown in FIGS. 1 and 2, an insulating film made of solder resist is provided on a surface 20a of the wiring substrate 20 excluding the connection portions of the lands 32, the connection pads 35, or the like. The solder resist film is made of, for example, an epoxy resin.

As shown in FIG. 2, a protect insulating film 3 is formed over a surface 1a of the semiconductor chip 1 and protect the non-depicted semiconductor circuit provided on the surface 1a. As a result, dusts or the like which occur in a manufacturing process are prevented from entering the semiconductor circuit and causing the semiconductor circuit to short out. Therefore, the semiconductor circuit can be protected.

As shown in FIG. 2B, the protect insulating film 3 has openings 3c that are filled with the electrode pads 30. The bump electrodes 31 are connected to the electrode pads 30, and to the connection pads 35 through adhesives 70.

The connection pad 35 includes a wiring portion 35a exposed onto a surface 20a of the wiring substrate 20 on the side opposite to the semiconductor chip 1, a wiring portion 35b exposed onto a surface 20b on the side of the semiconductor chip 1, and a via hole 38 connecting the wiring portions 35a and 35b.

The wiring portion 35a is connected to a land 32 through a wiring 37. The land 32 is connected to a ball terminal 33 which can be electrically connected to an eternal terminal and forms an external terminal 34.

The size of the external terminal 34 including the ball terminal 33 is determined in consideration of the size of the semiconductor chip 1. The external terminal 34 may be, but is not limited to, 0.3 mm in diameter and aligned at the pitch of 0.5 mm with respect to the semiconductor chip 1 of 10 mm×10 mm explained above.

The external terminals 34 including the ball terminals 33 and having the above size can densely be aligned at the above pith close to the electrode pads 30 on the semiconductor chip 1. In this manner, the electrode pads 30 on the semiconductor chip 1 are electrically connected to the external terminals 34 on the wiring substrate 20.

Further, the electrode pad 30 and the connection pad 35 are aligned in the same straight line perpendicular to the surface 1a of the semiconductor chip 1, making a length between each electrode pad 30 and the corresponding connection pad 35 shortest. As shown in FIG. 1, the external terminals 34 including the ball terminals 33 are densely aligned in two lines close to the electrode pads 30 on the semiconductor chip 1, making a length of each wiring 37 between the connection pad 35 and the corresponding external terminal 34 shortest.

In this manner, the electrode pads 30, the connection pads 35, the wirings 37, and the lands 32 are aligned so that the length of each wiring between each electrode pad 30 on the semiconductor chip 1 and the corresponding external terminal 34 on the wiring substrate 20 becomes shortest. Therefore, operation delay of the semiconductor device 11 can be prevented, making the processing speed of the semiconductor device 11 faster. Current noises that are likely to occur when the length of the wiring 37 or the via hole 38 is long can be reduced.

Further, the external terminals 34 including the ball terminals 33 are aligned in two lines and in a grid as shown in FIG. 1. Thereby, the external terminals 34 can be densely aligned. For example, the length from the connection portion 35a to the land 32 in the second line can be approximately 0.75 mm with respect to the semiconductor device 11 of 10 mm×10 mm explained above.

Since the external terminals 34 are densely aligned, the semiconductor device 11 can be smaller, current noises can be prevented from occurring when the lengths of the wirings are long, and stable electric signals can be conducted.

The ball terminal 33 may be, for example, a solder ball. Only the lands 32 may be connected to external terminals and form the external terminals 34 instead of the ball terminals 33 being mounted thereon. In other words, not only a BGA (ball grid array) type semiconductor device, but also an LGA (land grid array) type semiconductor device can be implemented.

The wiring substrate 20 cannot easily be removed from the semiconductor chip 1 since the connection pads 35 are connected to the bump electrodes 31 through the adhesives 70, and the wiring substrate 20 is fixed onto the semiconductor chip 1 through the underfill 5.

Figure 3A:
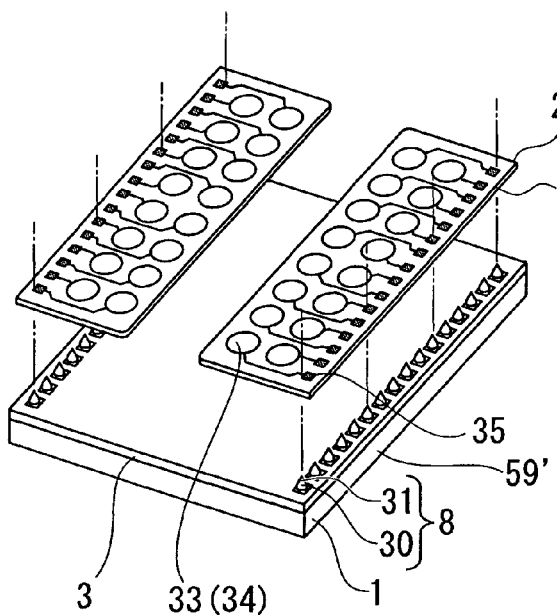
FIGS. 3A to 3C are perspective views illustrating connection types of wiring substrates and a semiconductor chip of the semiconductor device according to the first embodiment.
Figure 3B:
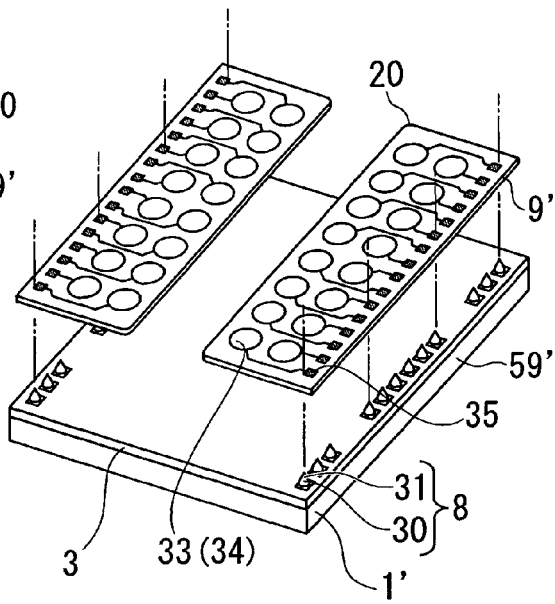
Figure 3C:
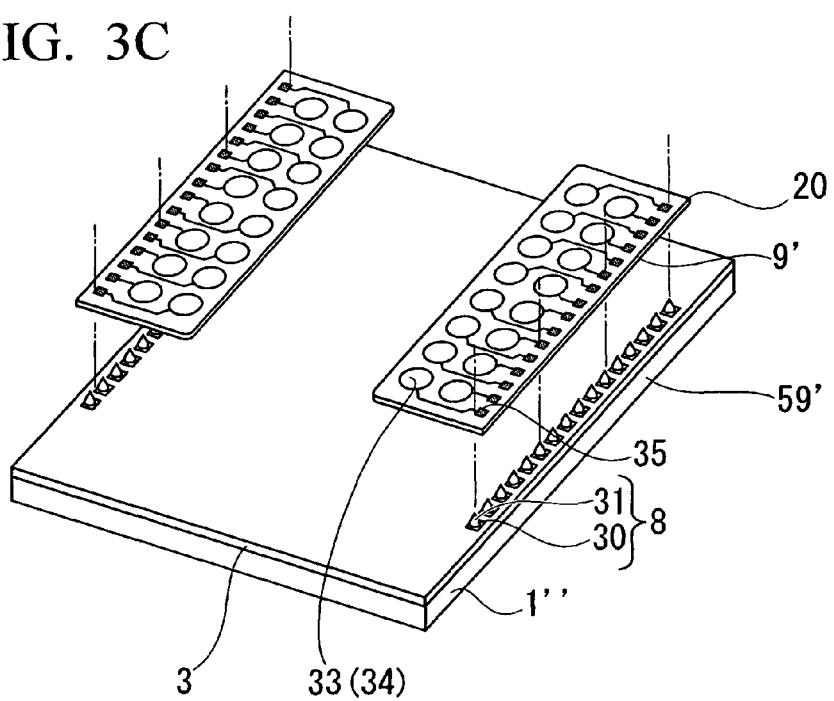

FIG. 3 is a perspective view illustrating connection types of the semiconductor chip and the wiring substrate according to the first embodiment. FIG. 3A shows a case where the number of the connection pads on the wiring substrate is identical to that of the electrode pads on the semiconductor chip. FIG. 3B shows a case where the number of the connection pads on the wiring substrate is different from that of the electrode pads on the semiconductor chip. FIG. 3C shows a case where a length of the dicing side of the semiconductor chip is made longer than that of the semiconductor chip shown in FIG. 3A.

As shown in FIG. 3A, the electrode pads 30 are aligned on the semiconductor chip 1 along the dicing sides 59' of the semiconductor chip 1. The bump electrodes 31 are respectively provided on the electrode pads 30, and the electrode pads 30 and the bump electrodes 31 form the terminals 8. The wiring substrates 20 are aligned on the semiconductor chip 1 along the dicing sides 59' of the semiconductor chip 1 which match the cut sides 9' of the wiring substrates 20.

As shown in FIG. 3, the size and the pitch of each connection pad 35 on the wiring substrate 20, and the distance between the connection pads and the dicing side 59' are commonly set so as to be applicable to semiconductor chips 1, 1' and 1". As a result, the wiring substrate 20 which is designed for the semiconductor chip 1 shown in FIG. 3A is applicable to the semiconductor chip 1' including the different number of electrode pads aligned differently as shown in FIG. 3B, and the semiconductor chip 1" having the different chip size as shown in FIG. 3C.

As shown in FIG. 3, the same wiring substrate 20 can be used for the semiconductor chip including the different number of electrode pads and the semiconductor chip in different size. Therefore, there is no need to form a new wiring substrate for each product, and costs for manufacturing semiconductor devices can be reduced.

For a semiconductor chip including the different number of electrode pads 30 between the opposing sides, wiring substrates can be designed and mounted on the semiconductor chip such that the number of connection pads 35 to be provided on the wiring substrates is different between two sides across the dicing line 59'.

When a small substrate is used as the wiring substrate 20, multiple wiring substrates can be mounted on one semiconductor chip 1 across the dicing line 59'. Further, a wiring substrate may be arranged on an intersection of the dicing lines 59' of four semiconductor chips 1 so that the wiring substrate can be cut into four pieces, each of which is mounted on the corresponding semiconductor chips 1.

Figure 4:
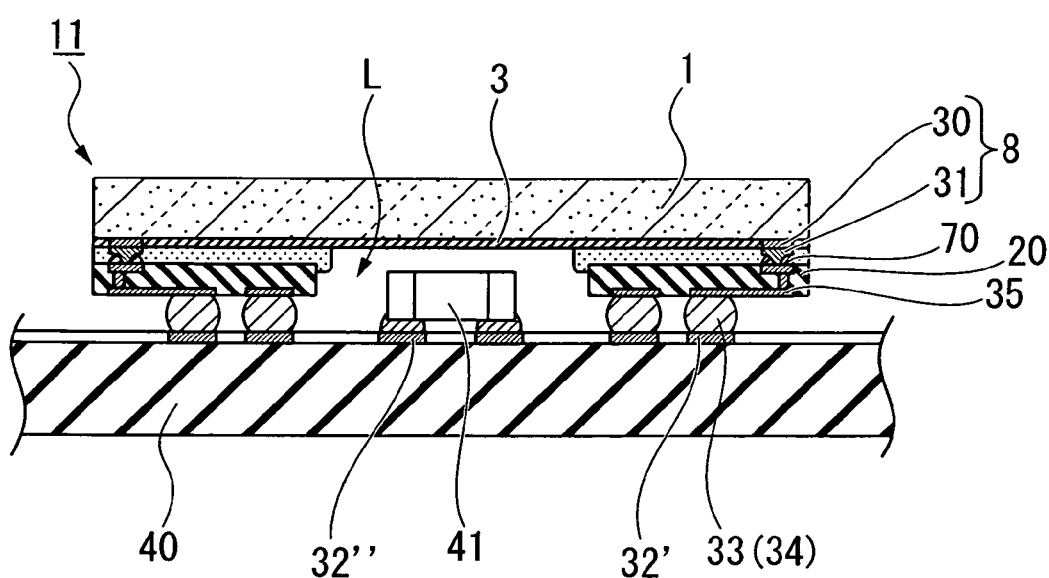
FIG. 4 is a cross-sectional view illustrating the semiconductor device according to the first embodiment being mounted on a mounting substrate.

FIG. 4 is a cross-sectional view illustrating the semiconductor device 11 being mounted on a mounting substrate 40.

The semiconductor device 11 is mounted on the mounting substrate 40 through the ball terminals 33 connected to lands 32' provided on the mounting substrate 40. A passive part 41 is connected onto different lands 32" provided on the mounting substrate 40. The passive part 41 is arranged in free space L that is in the center of the semiconductor device 11. The center free-space is formed by the wiring substrates 20 and the ball terminals 33 being densely arranged close to the electrode pads 30. In this manner, a passive part, such as a chip capacitor, a bare chip, a compact electronic part, or the like, can be mounted on the center free-space L, enhancing the packaging efficiency, and therefore contributing to miniaturization of the mounting substrate 40 including an electronic device, or the like.

According to the semiconductor device 11 of the first embodiment, the electrode pad 30 and the connection pad 35 are aligned in the same straight line perpendicular to the surface 1a of the semiconductor chip 1 in order to make a length from the electrode pad 30 to the connection pad 35 shortest. Additionally, the length of the wiring 37 from the connection pad 35 to the external terminal 34 is made shortest. Thereby, operating delay of the semiconductor device 11 can be prevented, and the processing speed thereof can be faster. Further, current noises that are likely to occur when the length of the via hole 38 is long can be reduced.

Additionally, the external terminals 34 including the ball terminals 33 are densely aligned in two lines close to the electrode pads 30. Thereby, the semiconductor device 11 can be further miniaturized. Therefore, current noises that are likely to occur when the length of the wirings are long can be reduced, and stable electric signals can be conducted. Further, free space L can be provided in the center of the semiconductor chip 1 where an active part, such as a chip capacitor, a bare chip, a compact electronic part, or the like, can be mounted, enhancing the packaging efficiency of the semiconductor device 11 and therefore contributing to miniaturization of the mounting substrate 40 including an electronic device or the like.

Further, the wiring substrate 20 is mounted on the semiconductor chip 1 along the dicing line 59' which matches the cut side 9' so that the three sides of the wiring substrate 20 excluding the cut side 9' are separated from each side of the semiconductor chip 1 by as much as possible. Additionally, the wiring substrate 20 has chamfered edges 20d. Thereby, the wiring substrate 20 can be prevented from being scratched by a manufacturing apparatus in a manufacturing process and removed from the semiconductor chip 1.

Moreover, the protect insulating film 3 is formed over the surface 1a of the semiconductor chip 1. Thereby, dusts or the like are prevented from entering the semiconductor circuit and causing the semiconductor circuit to short out, and the semiconductor circuit can be protected.

Additionally, the wiring substrate 20 is smaller than the semiconductor chip 1. Thereby, the greater number of wiring substrates 20 can be obtained from one original substrate in the process of forming the wiring substrates 20, reducing costs for manufacturing the semiconductor device 11. Additionally, stress caused by a difference in thermal expansion coefficients can be reduced, enhancing the reliability of a secondary mounting of the semiconductor device 11. Further, a chip-sized semiconductor device 11 can be implemented.

Further, the semiconductor chip 1 is connected to the wiring substrate 20 through the underfill 5 without elastomer, reducing costs for manufacturing the semiconductor device 11 and making the semiconductor device 11 thinner and lighter.

Moreover, the same wiring substrate 20 can be used for various types of semiconductor chips. Thereby, there is no need to form a new wiring substrate for a semiconductor chip including the different number of electrode pads, or a different-sized semiconductor chip, reducing costs for manufacturing the semiconductor device 11.

Hereinafter, a method of manufacturing the semiconductor device according to the first embodiment of the present invention is explained with reference to FIGS. 5A to 5F and FIG. 6.

FIGS. 5A to 5F are cross-sectional views indicative of a process flow illustrating a method of manufacturing the semiconductor device 11 according to the first embodiment. Like reference numerals represent like elements of the semiconductor device 11. Dicing lines 59 along which a semiconductor wafer 10 is cut into multiple semiconductor chips 1 are shown in FIGS. 5A to 5D.

Firstly, multiple semiconductor circuits (not shown) are formed on a substrate made of, for example, silicon to form multiple semiconductor chips 1, and then multiple electrode pads 30 are formed on the circumference of each semiconductor chip 1. Then, the insulating film 3 is provided over the semiconductor circuits to be protected. Thereby, the semiconductor wafer 10 on which the semiconductor chips 1 are mounted is formed.

Figure 5A:
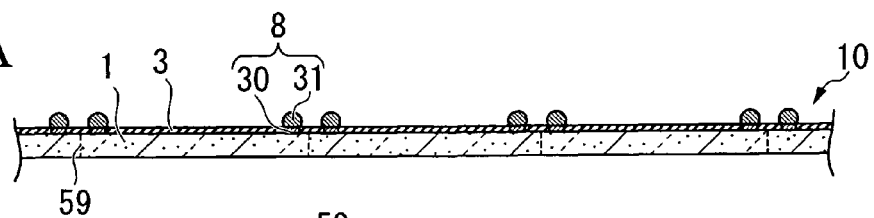
FIGS. 5A to 5F are cross-sectional views indicative of a process flow illustrating a method of manufacturing the semiconductor device according to the first embodiment.

Then, the bump electrodes 31 are respectively formed on the electrode pads 30 using a bonding apparatus (not shown). The bonding apparatus melts an edge of a wiring made of, for example, Au to be in a ball shape, and connects the melted edge onto the electrode pad 30 by ultrasonic thermocompression. Then, the other edge of the wiring is cut to form the bump electrode 31 on the electrode pad 30 as shown in FIG. 5A. Thereby, the electrode pad 30 and the bump electrode 31 form the terminal 8.

Figure 5B:
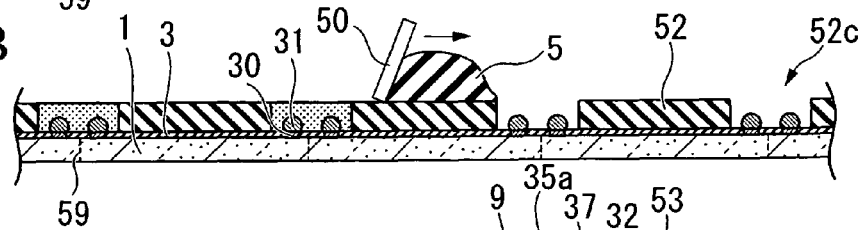

A print mask 52 having mask openings 52c at positions onto which the pre-cut wiring substrates 19 will be connected is formed on the semiconductor wafer 10. Then, underfills 5 are flowed onto the mask openings 52c using, for example, a squeegee 50 as shown in FIG. 5B. The print mask 52 is removed after the underfills 5 are flown onto every mask opening 52c.

Figure 5C:
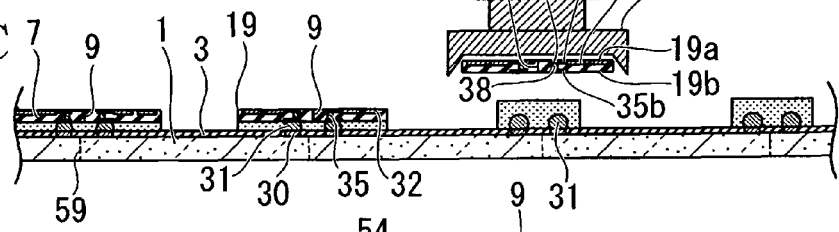

Then, the pre-cut wiring substrate 19 that is smaller than the semiconductor chip 1 is set to a collet chuck 53. As shown in FIG. 5C, the collet chuck 53 is moved to adjust the cutting line 9 of the pre-cut wiring substrate 19 to the dicing line 59 and to separate each side of the pre-cut wiring substrate 19 other than the cutting line 9 from the dicing line 59 by more than 50 μm.

Then, the collet chuck 53 is pushed down to fix the pre-cut wiring substrate 19 onto the semiconductor wafer 10 through the underfill 5 so that the electrode pad 30 of the semiconductor chip 1 is connected onto the connection pad 35. The underfill 5 has the size such that the underfill 5 is applied to the entire surface of the pre-cut wiring substrate 1 that is smaller than the semiconductor chip 1. Since the four sides of the pre-cut wiring substrate 19 are separated from each side of each semiconductor chip 1, the underfill 5 does not leak onto the adjacent semiconductor chip 1.

The connection portions 35b are provided along the cutting line 9 on a surface 19b of the pre-cut wiring substrate 19 which is on the side of the semiconductor chip 1. Thereby, the bump electrodes 31 of the semiconductor chip 1 are easily connected onto the connection portions 35b of the pre-cut wiring substrate 19 by the cutting line 9 being matched the dicing line 59.

The connection portions 35a connected to the connection portions 35b through the via holes 38, and the lands 32 connected to the connection portions 35a through the wirings 37 are provided on a surface 19a of the pre-cut wiring substrate 19 which is on the side opposite to the semiconductor chip 1. Thereby, the bump electrodes 31 of the semiconductor chip 1 are electrically connected to the lands 32.

Figure 5D:
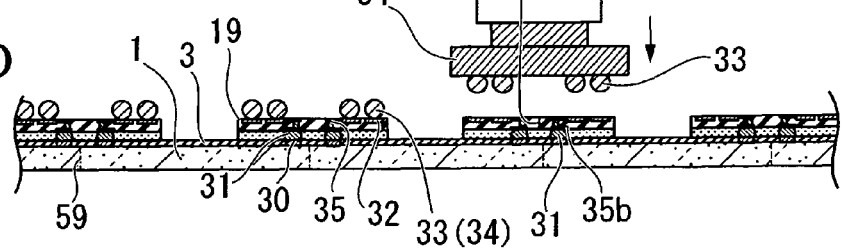
Figure 5E:
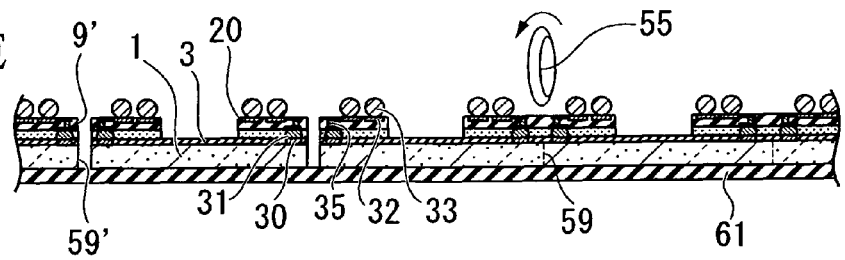

Then, the ball terminals 33 made of, for example, solder are set to a mounting apparatus 54, and the positions thereof are adjusted to those of the lands 32 on the pre-cut wiring substrate 19 as shown in FIG. 5D.

Then, the mounting apparatus 54 is pushed down in the direction indicated by an arrow shown in FIG. 5D, and thereby the ball terminals 33 are mounted and reflowed on the lands 32 on the pre-cut wiring substrate 19 to form the external terminals 34.

Although the mounting process is not limited hereto, the external terminals 34 are formed using, for example, the mounting apparatus 54 in the above manner. The mounting apparatus 54 includes multiple suction holes (not shown) corresponding to the lands 32 on the pre-cut wiring substrate 19. Accordingly, all of the ball terminals 33 can be held at the same time according to the number and positions of the lands 32 on the pre-cut wiring substrate 19 to be mounted on each semiconductor chip 1. Then, the ball terminals 33 can collectively be mounted on the pre-cut wiring substrate 19 by flux being applied to the ball terminals 33.

In this manner, the external terminals 34 including the ball terminals 33 are formed on the surface 19a of the pre-cut wiring substrate 19 that is opposite to the semiconductor chip 1. Thereby, the electrode pads 30 on the semiconductor chip 1 are electrically connected to the external terminals 34. Additionally, external terminals need not be provided on regions outside the semiconductor chip 1, making the semiconductor device 11 thinner and smaller.

Then, the semiconductor wafer 10 is cut along the dicing lines 59 into multiple semiconductor chips 1 using a dicing blade 55. As a result, the pre-cut wiring substrate 19 mounted on two semiconductor chips across the dicing line 59 is cut along the cutting line 9, and becomes wiring substrates 20. Each side of the semiconductor chip 1 becomes the dicing side 59', and the side of the wiring substrate 20 that has been cut becomes the cut side 9'.

In this dicing process, the rear side of the semiconductor wafer 10 is bonded onto a dicing tape 61 to be supported. Then, the semiconductor wafer 10 is cut along the dicing lines 59 into each semiconductor chip 1 using the dicing blade 55 of a dicing apparatus (not shown) rotating at high speed.

The semiconductor chip 1 and the pre-cut wiring substrate 19 are cut at the same time along the cutting line 9 provided in substantially the center of the pre-cut wiring substrate 19 fixed by the underfill 5. Therefore, the wiring substrate 20 is not removed from the semiconductor chip 1 upon the cutting.

The four sides of the pre-cut wiring substrate 19 are separated from the dicing lines, the dicing blade 55 does not contact the pre-cut wiring substrate 19 when only the semiconductor chips 1 are diced, preventing the wiring substrates 20 from being removed from the semiconductor chips 1.

Figure 5F:
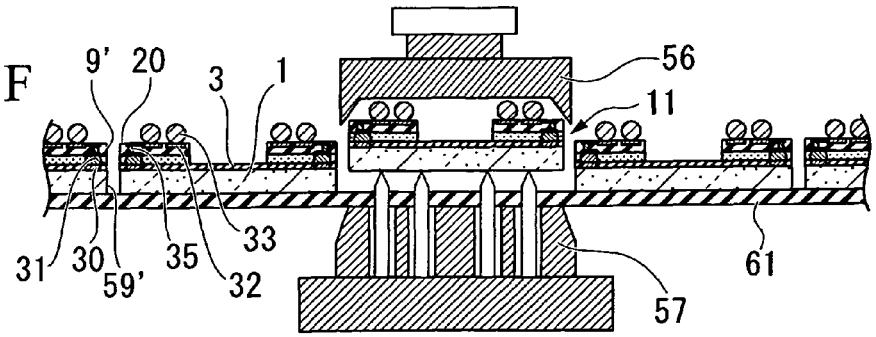

Then, each semiconductor chip 1 is picked up from the dicing tape 61 using a pushing apparatus 57 as shown in FIG. 5F. Thereby, the semiconductor device 11 as shown in FIGS. 1 and 2 can be obtained.

Figure 6:
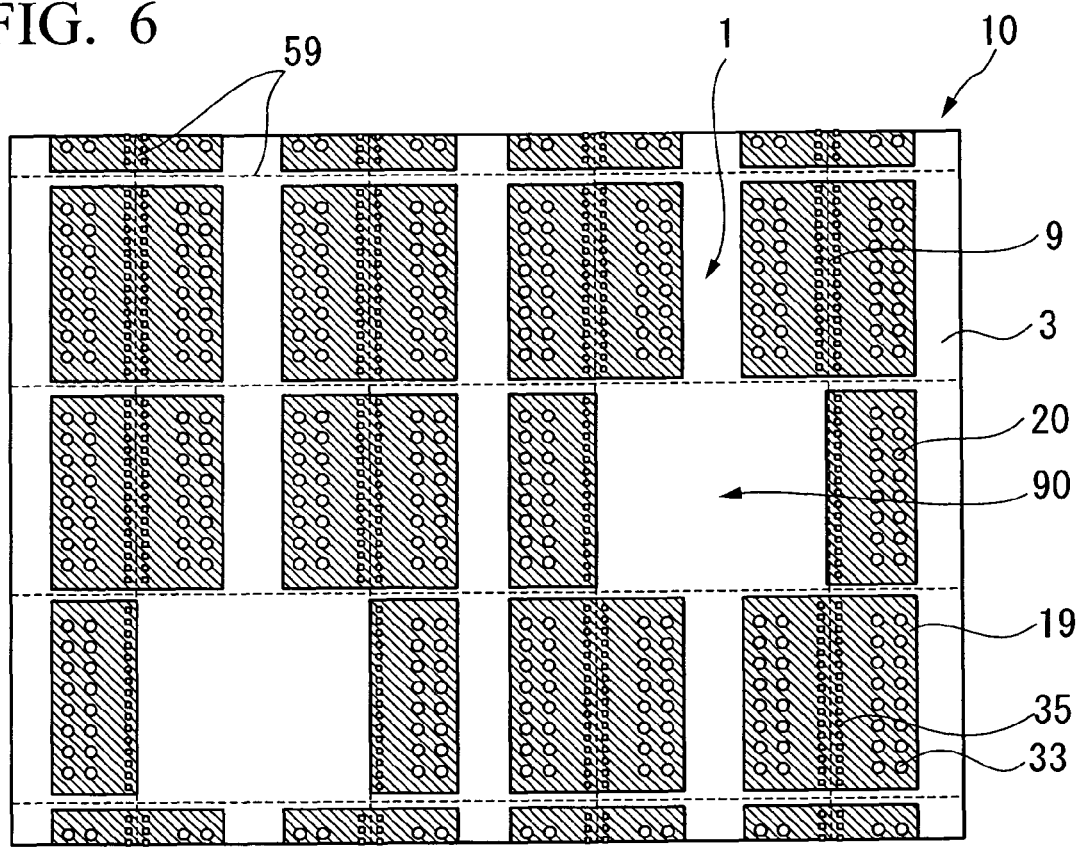
FIG. 6 is a plane view illustrating an example of the wiring substrates being mounted on a semiconductor wafer of the semiconductor device according to the first embodiment.

FIG. 6 is a plane view illustrating an example of the pre-cut wiring substrates being mounted on the semiconductor wafer at the state shown in FIG. 5D.

As shown in FIG. 6, the cutting lines of the pre-cut wiring substrates 19 are matched the dicing lines 59, and one pre-cut wiring substrate 19 is mounted on two semiconductor chips 1 across the dicing line 59.

If the wiring substrate 20 is mounted on each semiconductor chip 1, the wiring substrates 20 overlap each other in some cases. In the above method, however, the wiring substrates 20 are prevented from overlapping each other. Therefore, the semiconductor chip 1 on which the wiring substrates 20 are mounted can precisely and efficiently be formed. Further, the number of the pre-cut wiring substrates 19 to be mounted on the semiconductor wafer 10 can be reduced, enhancing the manufacturing efficiency.

The pre-cut wiring substrate 19 is applicable to various semiconductor chips 1 including a semiconductor chip having the different number of electrode pads or different positions of the electrode pads and a different-sized semiconductor chip by standardizing the size and a pitch of the connection pads 35, and the distance between the connection pads 35 and the dicing line 59.

Not only the semiconductor chip 1 including a non-defective semiconductor circuit, but also a semiconductor chip 90 including a defective semiconductor circuit are shown in FIG. 6. The pre-cut wiring substrate 19 is not arranged on the semiconductor chip 90 including the defective semiconductor circuit.

When the pre-cut wiring substrate 19 is mounted on the semiconductor chip 1, whether the semiconductor circuit is defective or non-defective is firstly determined. Then, the pre-cut wiring substrate 19 is mounted only on the semiconductor chip 1 including the semiconductor circuit that is determined to be non-defective.

At this time, a half piece of the pre-cut wiring substrate 19 is mounted on the non-defective semiconductor chip 1 along the dicing line across which the defective semiconductor chip 90 is located.

In this manner, the wiring substrates 20 are not wasted, reducing costs for manufacturing the semiconductor device 11.

The number of the pre-cut wiring substrates 19 each mounted on two semiconductor chips across the dicing line 59 is not limited hereto as long as the pre-cut wiring substrates 19 do not overlap each other. For example, two sheets of the pre-cut wiring substrates 19 may be mounted on two adjacent semiconductor chips across one common side thereof.

Additionally, the positions of the pre-cut wiring substrates 19 are not limited hereto as long as each pre-cut wiring substrate 19 is across the dicing line 59. For example, each pre-cut wiring substrate 19 may be mounted on four adjacent semiconductor chips at the intersection of two orthogonal dicing lines. In this case, each pre-cut wiring substrate 19 is cut into four wiring substrates 20 mounted on the four adjacent semiconductor chips 1.

Further, the size and the layout of the connection pads 35, the lands 32 and the like on the pre-cut wiring substrate 19 are symmetric to the cutting line 9 as shown in FIG. 6. However, the size and the layout thereof may not be symmetric to the cutting line 9. With the use of the pre-cut wiring substrate 19 having the asymmetric size and layout, the pre-cut wiring substrate 19 is applicable to the semiconductor chip 1 having the size and layout of the electrode pads that are asymmetric to opposing sides of the semiconductor chip 1.

According to the method of manufacturing the semiconductor device 11 of the first embodiment, the semiconductor wafer 10 having the dicing lines 59 and the pre-cut wiring substrate 19 having the cutting lines 9 are used, and the cutting lines 9 are matched the dicing lines 59 when the pre-cut wiring substrate 19 is mounted on the semiconductor chip 1. Therefore, the semiconductor device 11 including the semiconductor chip 1 onto which the pre-cut wiring substrate 19 is mounted can easily be formed.

Additionally, the connection pads 35 on the surface 19b of the pre-cut wiring substrate 19 are connected onto the terminals 8 on the semiconductor wafer 10, and then the dicing is performed to obtain the semiconductor chip 1. Thereby, the external terminals 34 can easily be formed on the surface 19a of the pre-cut wiring substrate 19 mounted on the semiconductor chip 1. Further, there is no need to provide external terminals on regions outside the semiconductor chip 1, making semiconductor device 11 thinner and smaller.

Further, the pre-cut wiring substrates 10 are mounted on the semiconductor wafer 10, and then the pre-cut wiring substrates 10 and the semiconductor wafer 10 are diced at the same time. Thereby, the semiconductor device 11 can efficiently be manufactured.

Moreover, each pre-cut wiring substrate 19 is mounted on adjacent two semiconductor chips. Thereby, the wiring substrates 20 do not overlap each other, which occurs if the wiring substrates are mounted on each semiconductor chip 1. Therefore, the semiconductor chip 1 on which the wiring substrates 20 are mounted can precisely and efficiently be formed. Further, the number of pre-cut wiring substrates 19 to be mounted on the semiconductor wafer 10 can be reduced, enhancing the manufacturing efficiency.

Additionally, the same pre-cut wiring substrate 19 can be used for various types of semiconductor chips 1, reducing costs for manufacturing the semiconductor device 11.

Second Embodiment

Hereinafter, a second embodiment of the present invention is explained.

Figure 7:
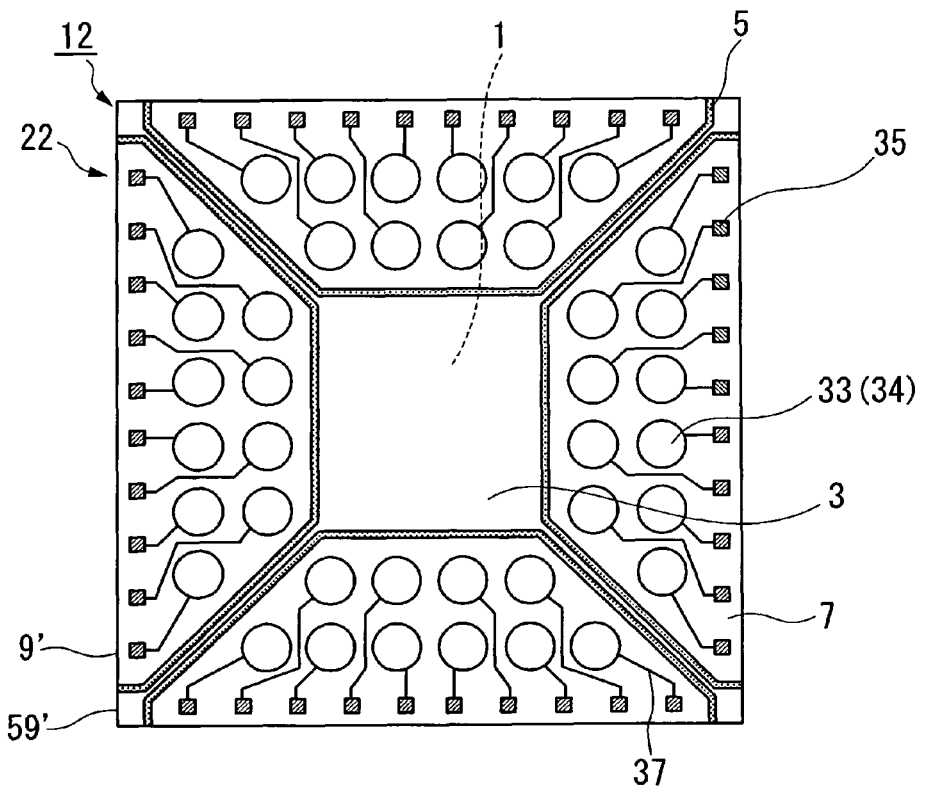
FIG. 7 is a plane view illustrating a semiconductor device according to a second embodiment of the present invention.

FIG. 7 is a plane view illustrating a semiconductor device 12 according to the second embodiment of the present invention. In the semiconductor device 12, cut sides 9' of wiring substrates 22 in substantially a trapezoidal shape are matched the dicing sides 59' of the semiconductor chip 1 in substantially a rectangular shape. Like reference numerals represents like elements of the first embodiment.

Figure 8:
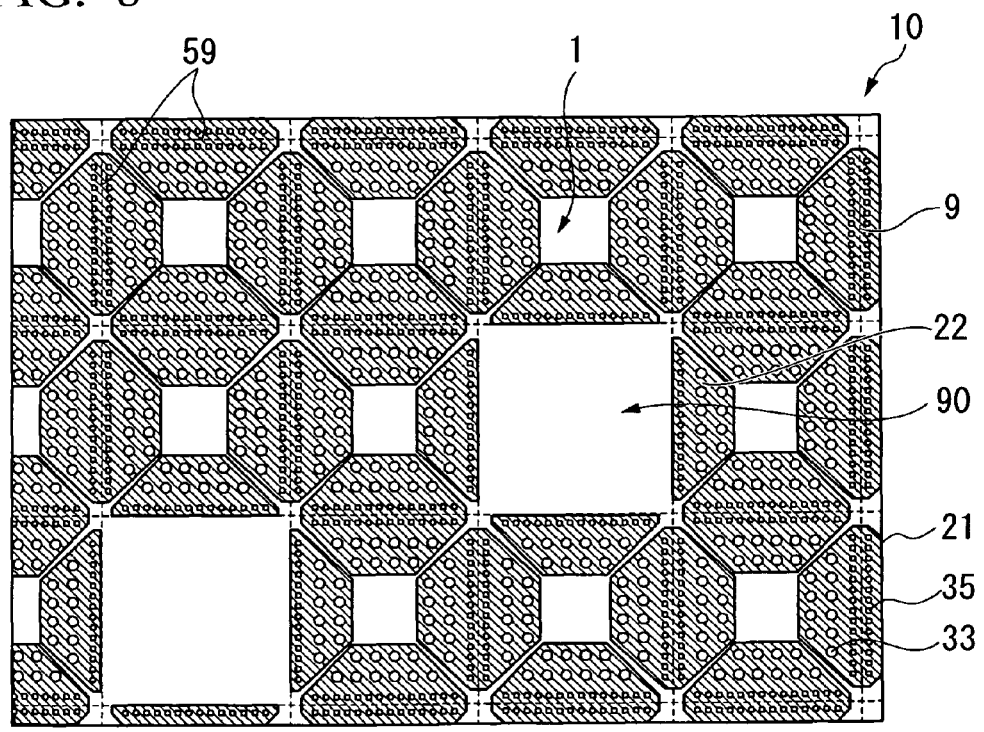
FIG. 8 is a plane view illustrating an example of wiring substrates being mounted on a semiconductor wafer of the semiconductor device according to the second embodiment.

FIG. 8 is a plane view illustrating an example of pre-cut wiring substrates 21 being mounted on the semiconductor wafer 10. As shown in FIG. 8, one pre-cut wiring substrate 21 is mounted on two adjacent semiconductor chips 1 across the dicing line 59 of the semiconductor chip 1 which matches the cutting line 9 of the pre-cut wiring substrate 21.

The pre-cut wiring substrates 21 and the semiconductor wafer 10 are diced at the same time along the dicing lines 59. Thereby, the pre-cut wiring substrates 21 become wiring substrates 22, and a semiconductor device 12 including the semiconductor chip 1 on which four wiring substrates 22 are mounted is formed.

Since the wiring substrate 22 is in substantially a trapezoidal shape, the wiring substrates 22 can densely be aligned on the semiconductor chip 1, allowing the semiconductor device 12 to be smaller.

The shape of the wiring substrate 22 is not limited hereto as long as the wiring substrates 22 do not overlap each other. Preferably, the edges of the wiring substrate 22 are chamfered so that the mounted wiring substrates 22 are prevented from being removed from the semiconductor chip 1.

The structure of the second embodiment has a similar structure as that of the first embodiment. Therefore, similar effects to those of the first embodiment can be achieved.

Third Embodiment

Hereinafter, a third embodiment of the present invention is explained.

Figure 9:
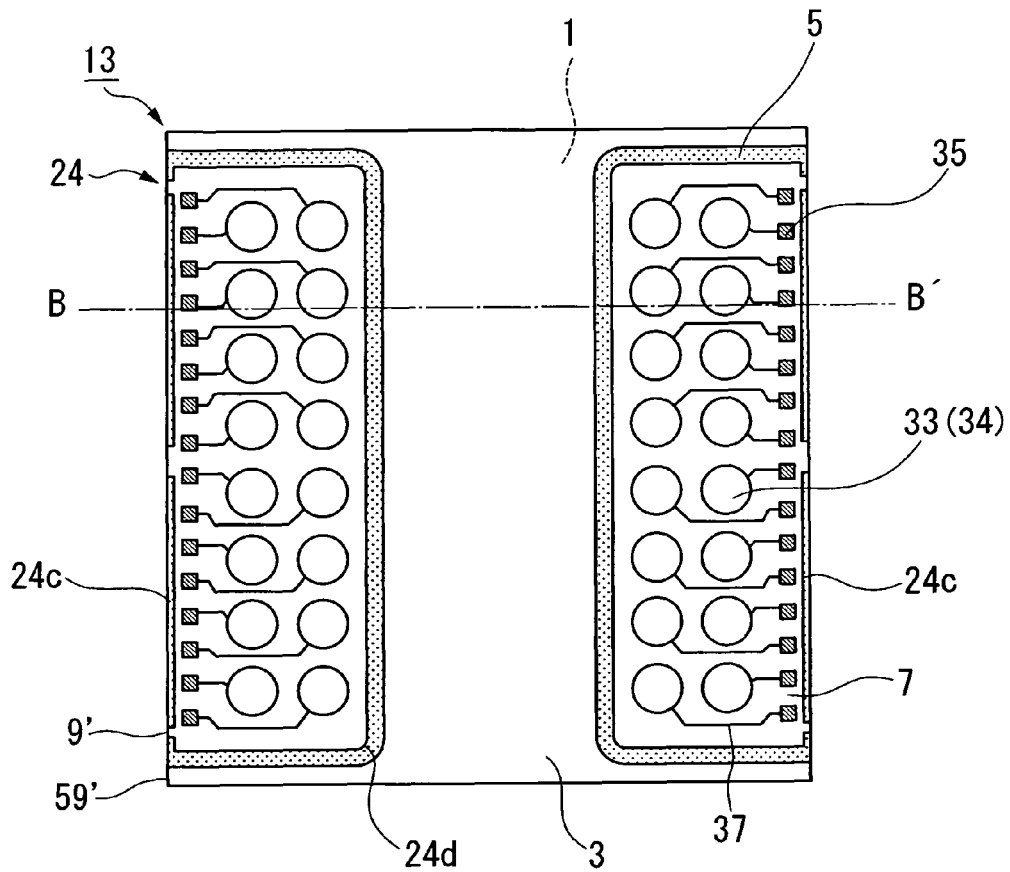
FIG. 9 is a plane view illustrating a semiconductor device according to a third embodiment of the present invention.
Figure 10:
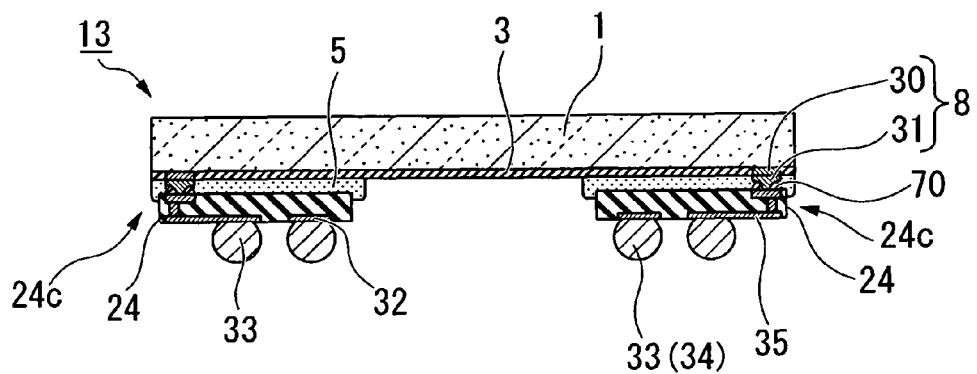
FIG. 10 is a cross-sectional view taken along a line B-B' shown in FIG. 9.
Figure 11:
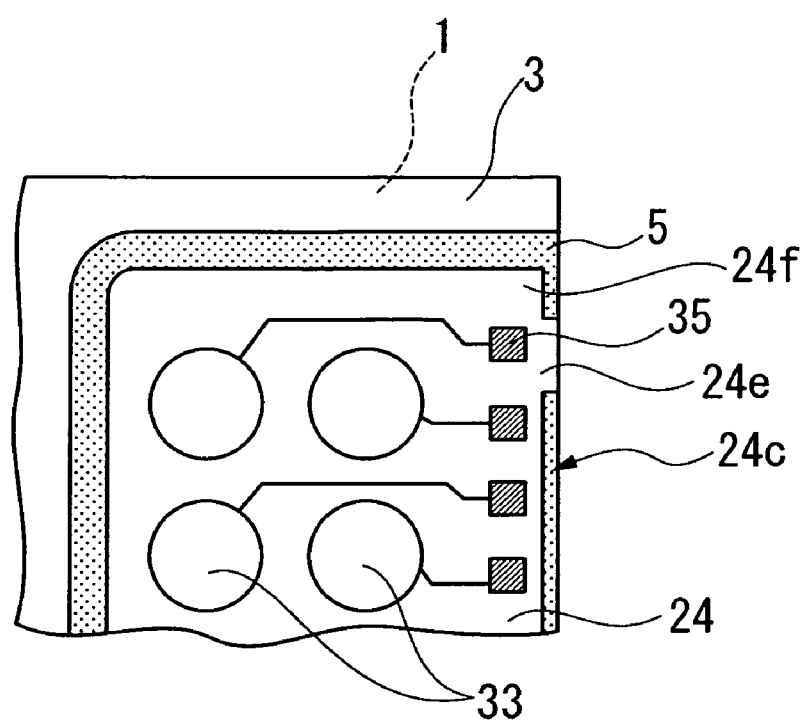
FIG. 11 is a partially enlarged view of FIG. 10.

FIG. 9 is a plane view illustrating a semiconductor device 13 according to the third embodiment of the present invention. FIG. 10 is a cross-sectional view taken along a line B-B' shown in FIG. 9. FIG. 11 is a partially-enlarged view of the FIG. 9.

In the semiconductor device 13, wiring substrates 24 in substantially a rectangular shape are mounted on the semiconductor chip 1 in substantially a rectangular shape along the opposing sides of the semiconductor chip 1 that are the dicing sides 59' which match the cut sides 9'. Like reference numerals represent like elements of the first embodiment.

As shown in FIGS. 9 to 11, gas-release openings 24c in substantially a rectangular shape are provided on the wiring substrates 24 along the cut sides 9'. As a result, gas can be released when pre-cut wiring substrates (not shown) are mounted on the semiconductor chip 1, preventing voids between the semiconductor chip 1 and the wiring substrates.

Further, only connection portions 24e of the pre-wiring substrates need to be cut when the semiconductor wafer 10 is diced, reducing the risk of the pre-cut wiring substrates being removed from the semiconductor wafer 10 upon dicing.

Moreover, the gas-release openings 24c can be provided at edge portions 24f of the wiring substrate 24. Thereby, the connection portions 24e need not be provided at the edge portions 24f, reducing regions of the pre-cut wiring substrates to be cut upon dicing the semiconductor wafer 10, and preventing the wiring substrate 24 from being removed from the semiconductor chip 1.

With the structure of the third embodiment, similar effects to those of the first embodiment can be achieved.

Fourth Embodiment

Hereinafter, a fourth embodiment of the present invention is explained.

Figure 12:
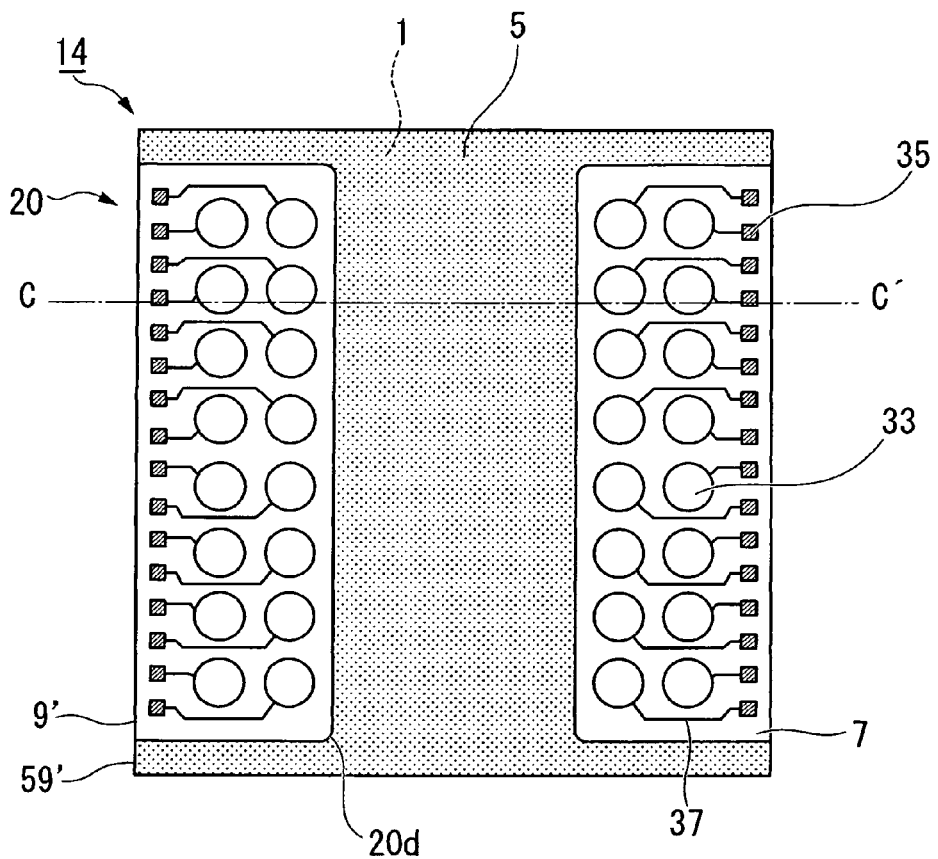
FIG. 12 is a plane view illustrating a semiconductor device according to a fourth embodiment of the present invention.
Figure 13:
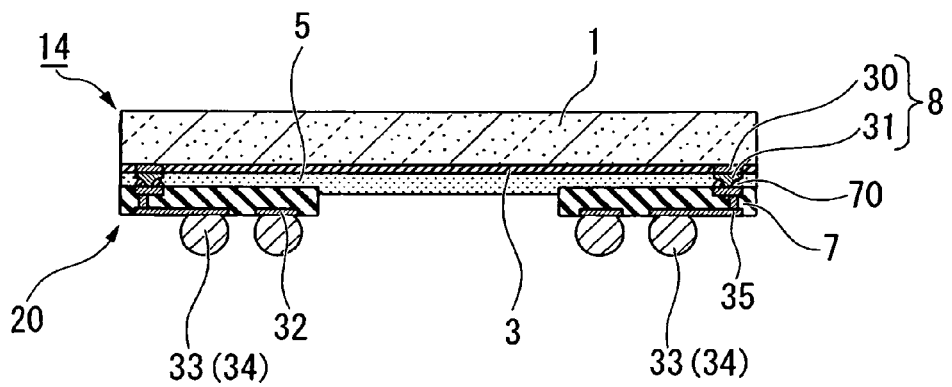
FIG. 13 is a cross-sectional view taken along a line C-C' shown in FIG. 12.

FIG. 12 is a plane view illustrating a semiconductor device 14 according to a fourth embodiment of the present invention. FIG. 13 is a cross-sectional view taken along a line C-C' shown in FIG. 12.

In the semiconductor device 14, the wiring substrates 20 in substantially a rectangular shape are mounted on the semiconductor chip 1 along the opposing sides of the semiconductor chip 1 in substantially a rectangular shape while the dicing sides 59' of the semiconductor device 1 match the cut sides 9' of the wiring substrates 20. Like reference numerals represent like elements of the first embodiment.

A difference from the semiconductor device of the first embodiment is in that the underfill 5 covers the entire protect insulating film 3 provided on the surface 1a of the semiconductor chip 1. By the underfill 5 being provided in this manner, a semiconductor circuit formed on the surface 1a of the semiconductor chip 1 can further be protected.

FIGS. 14A to 14F are cross-sectional views indicative of a process flow illustrating a method of forming the semiconductor device 14 according to the fourth embodiment.

The method of forming the semiconductor device 14 includes similar processes to those of the method of forming the semiconductor device 11 of the first embodiment. A difference therebetween is in that the underfill forming process is not the printing process using a print mask, but a coating process by which the underfill 5 is formed so as to cover the entire protect insulating film 3. Like reference numerals represent like elements of the first embodiment.

Figure 14A:
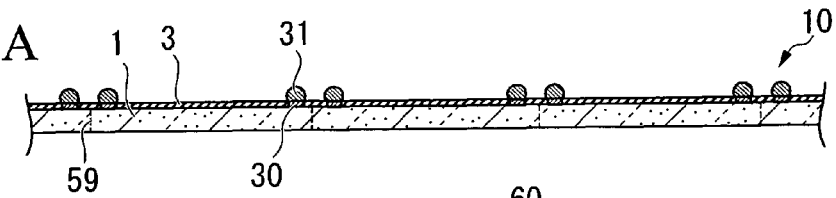
FIGS. 14A to 14F are cross-sectional views indicative of a process flow illustrating a method of manufacturing the semiconductor device according to the fourth embodiment.
Figure 14B:
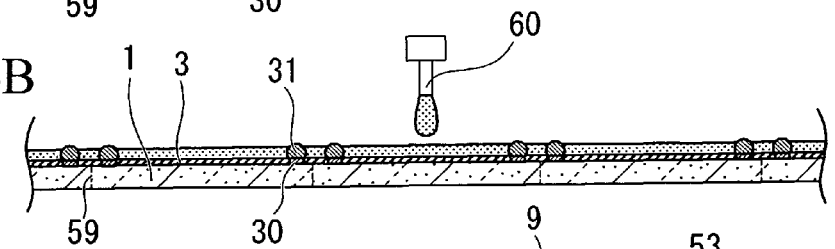
Figure 14C:
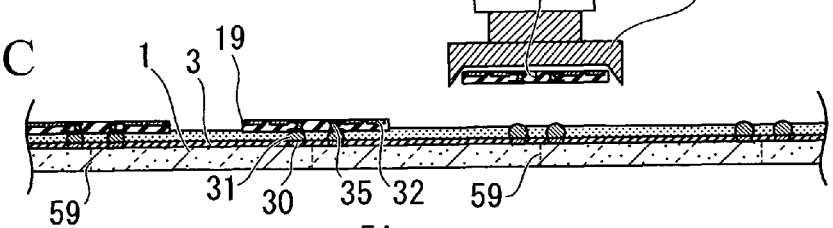
Figure 14D:
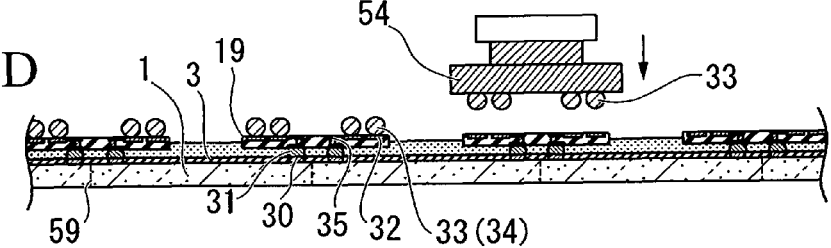
Figure 14E:
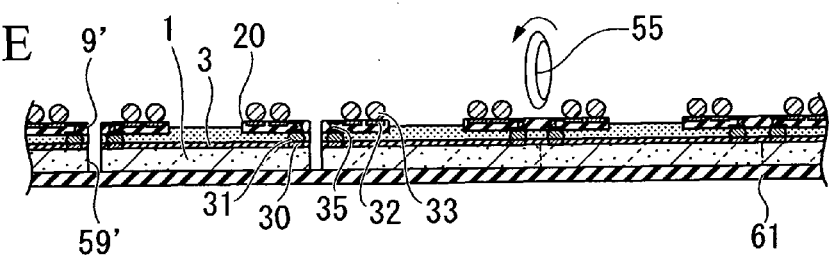
Figure 14F:
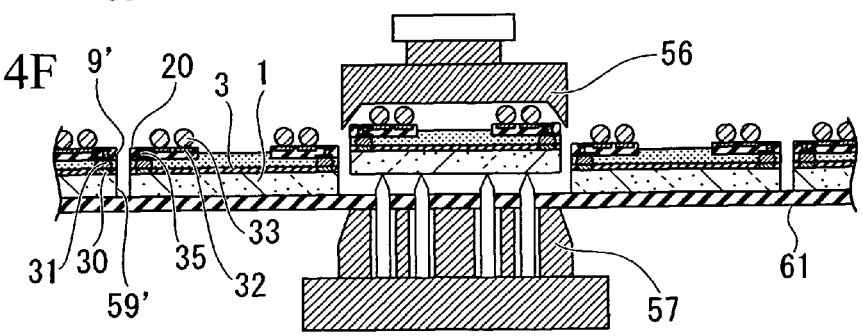

As shown in FIG. 14B, an underfill material 5 is dropped by an applicator 60 over the protect insulating film 3 provided on the surface 1a of the semiconductor chip 1 to form the underfill 5. At this time, the underfill material 5 may be dropped to form the underfill 5 while the semiconductor wafer 10 is rotated by a spin coater. Thereby, the underfill 5 can be formed with a precise thickness.

Then, the cutting lines 9 of the pre-cut wiring substrates 19 are matched the dicing lines 59 of the semiconductor chip 1, and the pre-cut wiring substrates 19 are mounted on the semiconductor chip 1 across the dicing lines 59.

In the fourth embodiment, similar effects to those of the first embodiment can be achieved. The underfill 5 can more easily be formed with a precise thickness using the coating process, such as a spin coating process, enhancing the efficiency of forming the semiconductor device 14.

Fifth Embodiment

Hereinafter, a fifth embodiment of the present invention is explained.

Figure 15:
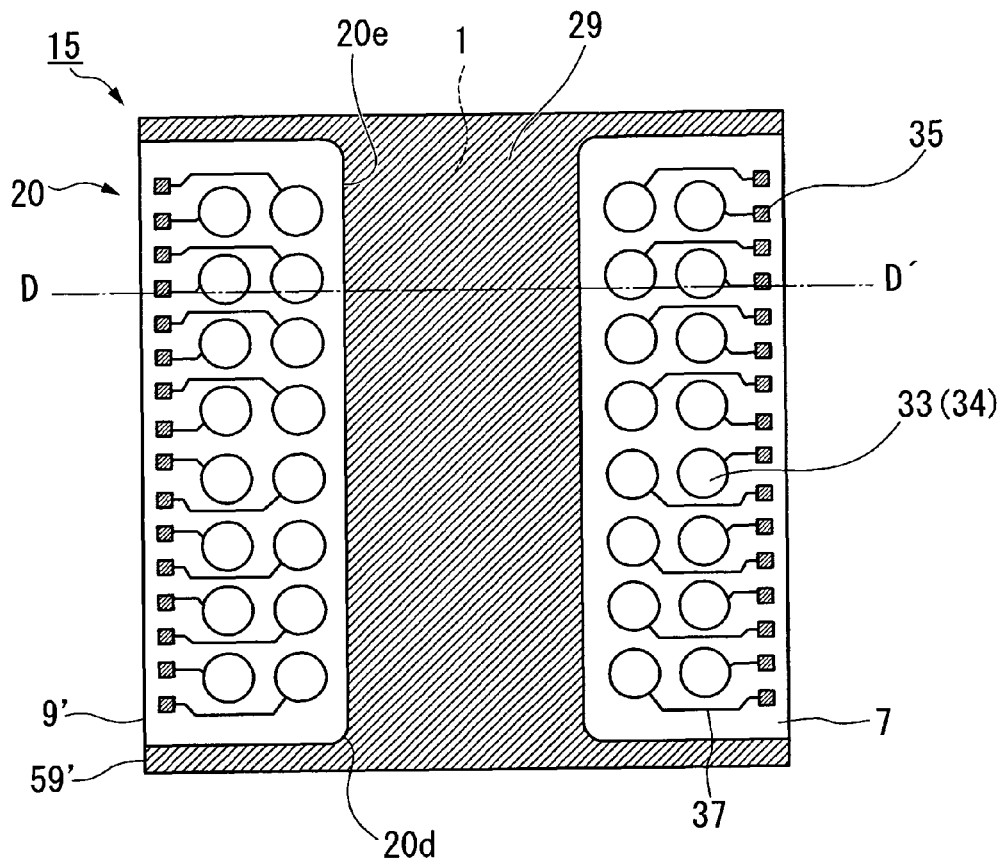
FIG. 15 is a plane view illustrating a semiconductor device according to a fifth embodiment of the present invention.
Figure 16:
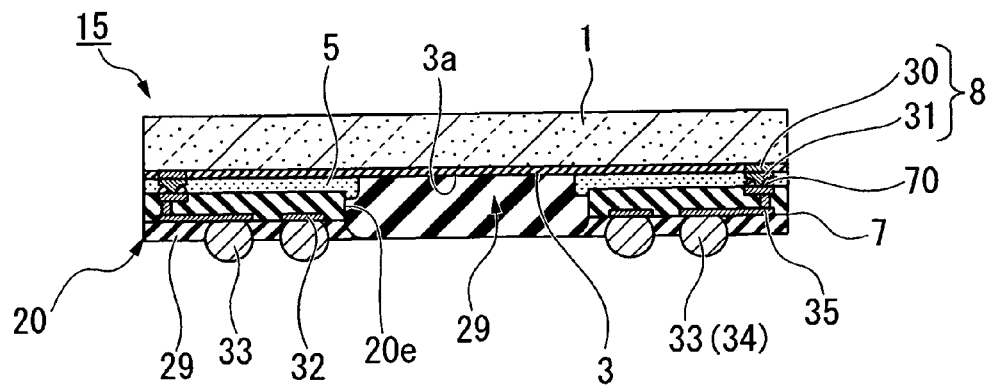
FIG. 16 is a cross-sectional view taken along a line D-D' shown in FIG. 15.

FIG. 15 is a plane view illustrating a semiconductor device 15 according to a fifth embodiment of the present invention. FIG. 16 is a cross-sectional view taken along a line D-D'.

In the semiconductor device 15, the wiring substrates 20 in substantially a rectangular shape are mounted on the semiconductor chip 1 along the opposing sides of the semiconductor chip 1 in substantially a rectangular shape while the dicing sides 59' of the semiconductor device 1 match the cut sides 9' of the wiring substrates 20. Like reference numerals represent like elements of the first embodiment.

A difference from the semiconductor device of the first embodiment is in that a protector 29 is formed so as to cover an exposed surface 3a of the protect insulating film 3. By the protector 29 being provided in this manner, a semiconductor circuit formed on the surface 1a of the semiconductor chip 1 can further be protected.

The protector 29 may be made of an insulating resin and formed by, for example, potting. The insulating resin is in contact with the side surface 20e of the wiring substrate 20. Thereby, the connection strength of the semiconductor chip 1 and the wiring substrate 20 can be further enhanced.

In the fifth embodiment, similar effects to those of the first embodiment can be achieved.

Sixth Embodiment

Hereinafter, a sixth embodiment of the present invention is explained.

Figure 17:
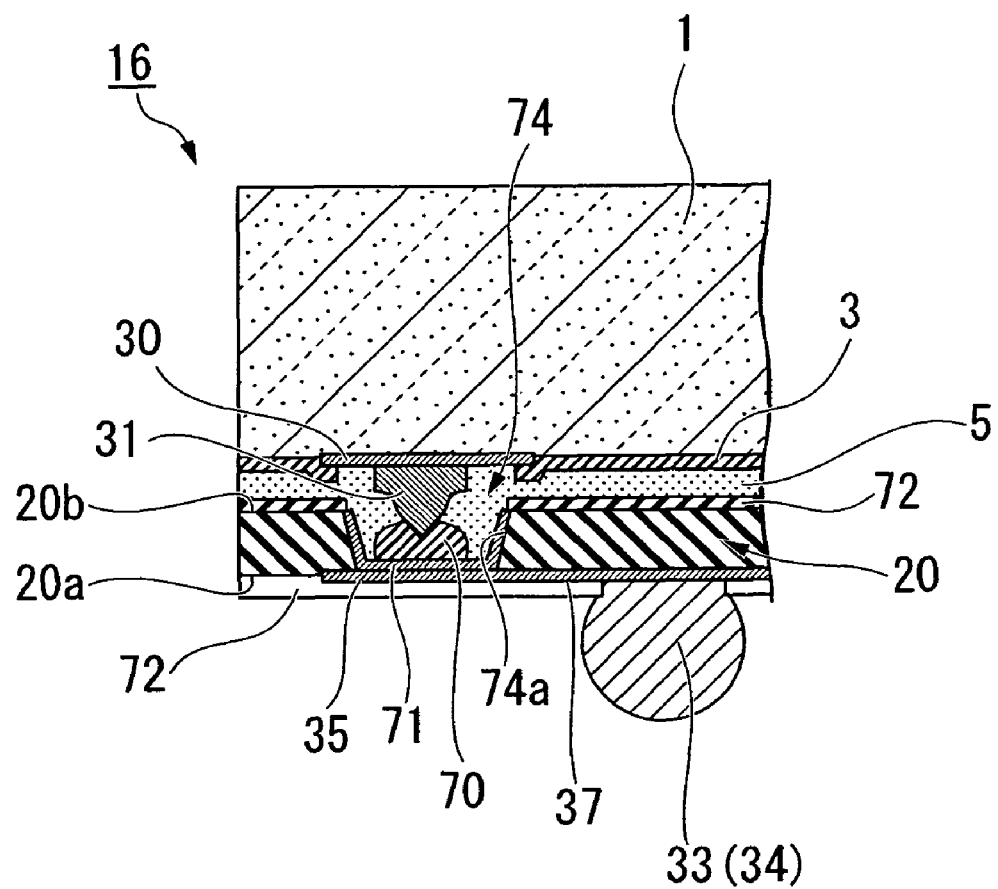
FIG. 17 is a plane view illustrating a semiconductor device according to a sixth embodiment of the present invention.

FIG. 17 is a partially enlarged view illustrating a semiconductor device 16 according to a sixth embodiment of the present invention. In the semiconductor device 16, the semiconductor chip 1 is mounted on the wiring substrate 20 through the underfill 5. The surface 1a of the semiconductor chip 1 is covered by the protect insulating film 3. Apart of the protect oxide film 3 is opened to form the electrode pad 30 onto which the bump electrode 31 is connected. Like reference numerals represent like elements of the first embodiment.

Both surfaces of the wiring substrate 20 are covered by solder resist film 72. A recess 74 is provided on the surface 20b of the wiring substrate 20 which is on the side of the semiconductor chip 1. A plating film 71 is formed on an inner surface 74a of the recess 74. The plating film 71 is connected to the connection pad 35, and to the external terminal 34 including the ball terminal 33 and provided on the surface 20a opposite to the semiconductor chip 1 through the wiring 37.

The bump electrode 31 of the semiconductor substrate 1 is connected to the connection pad 35 on the wiring substrate 20 through the adhesive 70. Thereby, the electrode pad 30 is electrically connected to the external terminal 34. The portions excluding the connection portion are insulated by the solder resist film. The solder resist film may be made of, for example, an epoxy resin.

The plating film 71 is made of, for example, Cu, Ni, or Au, by which the semiconductor chip 1 can electrically be connected to the wiring substrate 20 in a good condition. The plating film 71 is formed on the inner surface 74a of the recess 74. Thereby, the electrically-connected area of the semiconductor chip 1 and the wiring substrate 20 can be larger. Further, the semiconductor device 16 can be thinner. Additionally, a via hole required for the connection pad 35 of the first embodiment can be eliminated. Thereby, the length between the electrode pad 30 and the ball terminal 33 can be shortened, further enhancing the electrical properties of the semiconductor device 16.

In the sixth embodiment, similar effects to those of the first embodiment can be achieved.

Seventh Embodiment

Hereinafter, a seventh embodiment of the present invention is explained.

Figure 18:
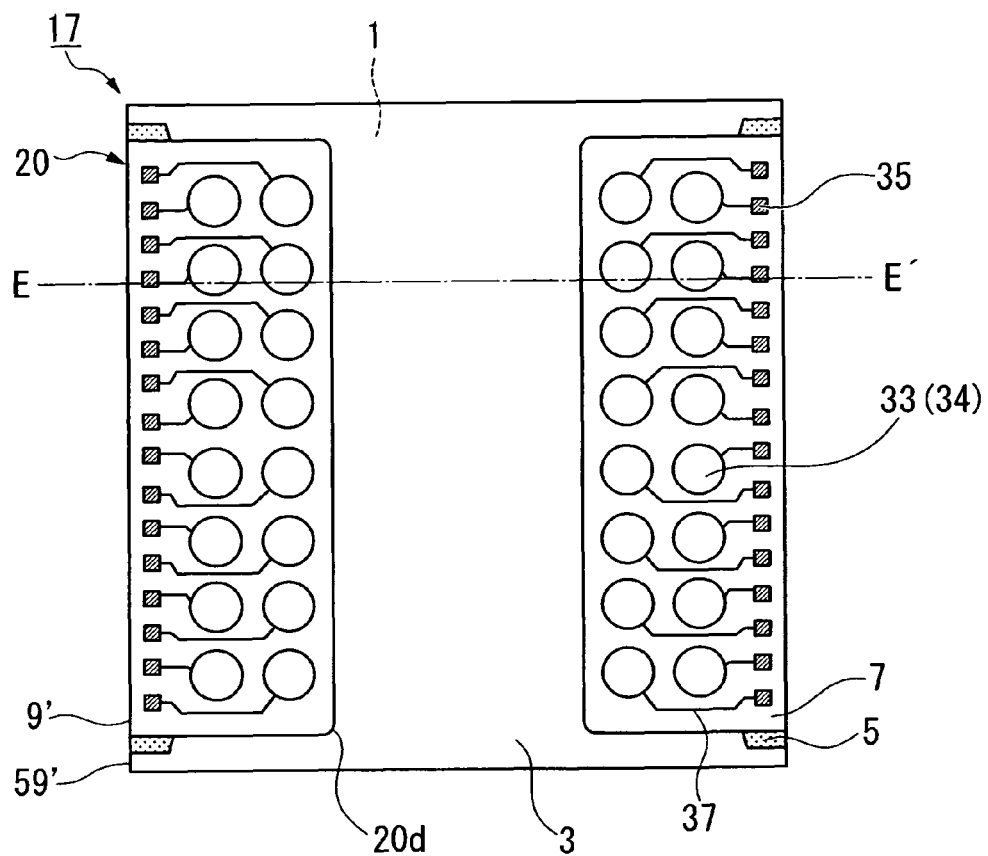
FIG. 18 is a plane view illustrating a semiconductor device according to a seventh embodiment of the present invention.
Figure 19:
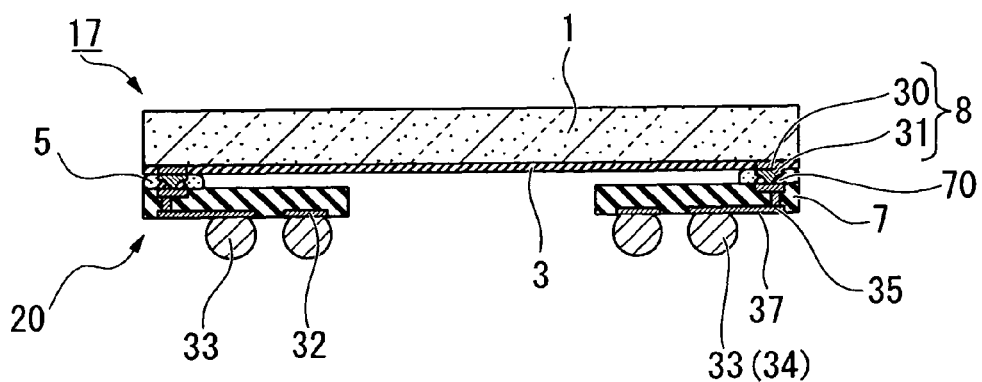
FIG. 19 is a cross-sectional view taken along a line E-E' shown in FIG. 18.

FIG. 18 is a plane view illustrating a semiconductor device 17 according to a seventh embodiment of the present invention. FIG. 19 is a cross-sectional view taken along a line E-E' shown in FIG. 18.

As shown in FIGS. 18 and 19, a difference from the semiconductor device of the first embodiment is in that the underfill 5 is provided not to cover the entire surface of the wiring substrate 20, but to cover only circumferences of the connection pads, i.e., the connection pads 35, the bump electrodes 31, and the electrode pads 30. Like reference numerals represent like elements of the first embodiment.

Thus, only the circumferences of the connection pads on the wiring substrate 20 are covered by the underfill 5, and therefore the other portions of the wiring substrate 20 are not fixed onto the semiconductor chip 1. Therefore, stress caused by a difference in thermal expansion coefficients can be reduced, enhancing the reliability of a secondary mounting of the semiconductor device 17.

In the seventh embodiment, similar effects to those of the first embodiment can be achieved.

Eighth Embodiment

Hereinafter, an eighth embodiment of the present invention is explained.

Figure 20:
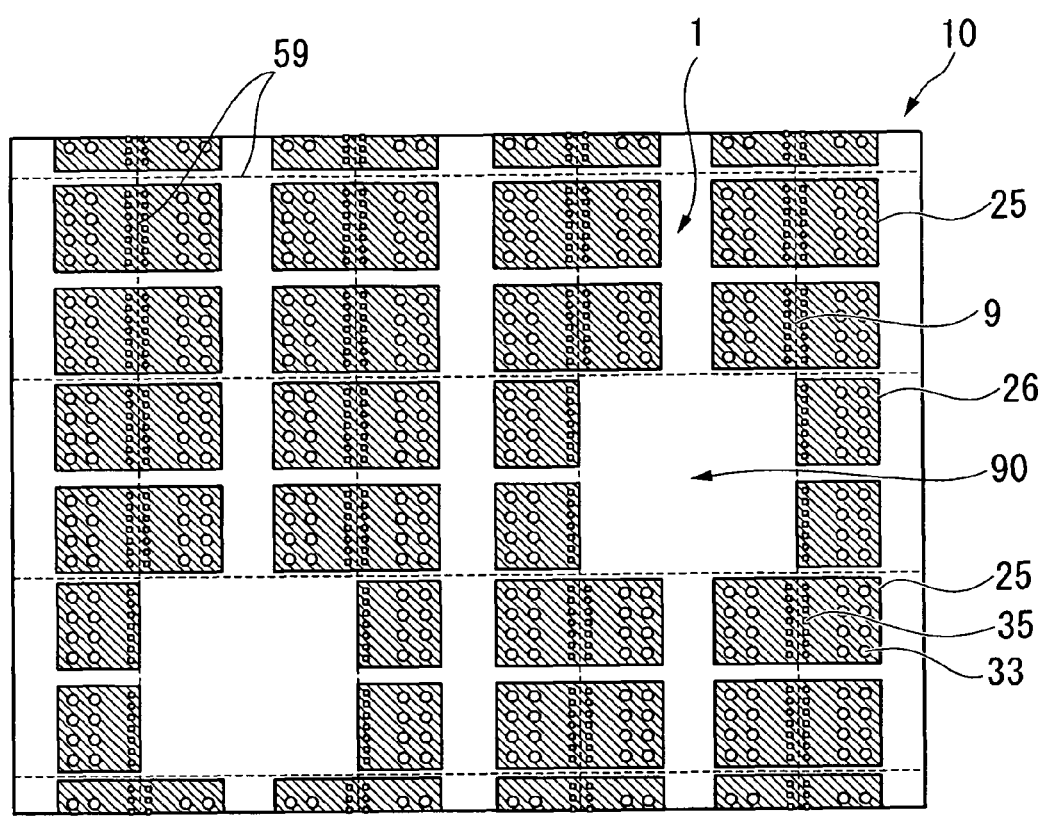
FIG. 20 is a plane view illustrating a semiconductor device according to an eighth embodiment of the present invention.

FIG. 20 is a plane view illustrating a semiconductor device according to an eighth embodiment of the present invention. As shown in FIG. 20, a difference from the semiconductor device of the first embodiment is in that two pre-cut wiring substrates 25 that are smaller than the pre-cut wiring substrate 19 of the first embodiment are mounted on the semiconductor chip 1 across one dicing side.

Similarly to the first embodiment, the two half pieces of the pre-cut wiring substrates 25 are mounted on a non-defective semiconductor circuit along the dicing line 59 of the defective semiconductor circuit 90.

Thus, the small pre-cut wiring substrate 25 is applicable to a semiconductor chip smaller than the semiconductor chip 1, and therefore various semiconductor chips. Therefore, costs for manufacturing semiconductor devices can be reduced.

In the eighth embodiment, similar effects to those of the first embodiment can be achieved.

The present invention is applicable to semiconductor manufacturing and utilizing industries.

It is apparent that the present invention is not limited to the above embodiments, but may be modified and changed without departing from the scope and spirit of the invention.

What is claimed is:

1. A method of manufacturing a semiconductor device, comprising:

forming terminals on a wafer and across each of dicing lines along which the wafer is cut into a plurality of semiconductor chips;

preparing a plurality of pre-cut substrates each including a substrate body capable of being cut along corresponding one of cutting lines into a pair of same structured substrate pieces, connection pads provided on a top surface of the substrate body, and external terminals formed on a bottom surface of the substrate body and connected to the connection pads;

mounting the pre-cut substrates onto the wafer while the cutting lines of the pre-cut substrates match the dicing lines such that a first substrate and a second substrate of the pre-cut substrates are mounted on a first chip of the plurality of semiconductor chips, the first substrate overlaps a first dicing line of the first chip and the second substrate overlaps a second dicing line of the first chip; and simultaneously dicing the wafer and the pre-cut substrates along the dicing lines matching the cutting lines such that a first portion of the first substrate and a second portion of the second substrate remain mounted on the first chip.

2. The method according to claim 1, further comprising determining whether a semiconductor circuit to be included in each of the semiconductor chips is defective or non-defective before the pre-cut substrates are mounted on the wafer, wherein the pre-cut substrates are mounted onto the wafer at portions corresponding to the semiconductor chips each having the semiconductor circuit determined to be non-defective.

3. The method according to claim 2, wherein halves of the pre-cut substrates are respectively mounted onto the wafer at portions corresponding to the semiconductor chips each having the semiconductor circuit determined to be non-defective along the dicing lines of adjacent semiconductor chips each having the semiconductor circuit determined to be defective.

4. The method according to claim 1, further comprising:

forming bump electrodes respectively onto electrode pads to form the terminals; and forming underfills to respectively cover the terminals, wherein the mounting comprises mounting the pre-cut substrates onto the wafer through the underfills.

5. The method according to claim 4, wherein the underfills are formed using a print mask at the forming of the underfills.

6. The method according to claim 4, wherein the underfills are formed by dropping an underfill material over the wafer at the forming of the underfills.

7. A method comprising:

forming a semiconductor wafer that includes a plurality of semiconductor chips which are separated from one another by a dicing line area between adjacent ones of the semiconductor chips, each of the semiconductor chips including first and second sides opposed to each other, a first set of electrode pads arranged along the first side and a second set of electrode pads arranged along the second side;

forming a plurality of wiring substrates separately from each other, each of the wiring substrates including third and fourth sides, a first set of external terminals arranged along the third side, a second set of external terminals arranged along the fourth side, mounting the wiring substrates on the semiconductor wafer such that each of the wiring substrates is connected at the first set of external terminals thereof to the first set of electrode pads of an associated one of the semiconductor chips and at the second set of external terminals thereof to the second set of electrode pads of an adjacent semiconductor chip to the associated one of the semiconductor chips, each of the wiring substrates being at a center portion thereof over the dicing line area between the associated one of the semiconductor chips and the adjacent semiconductor chip; and dicing the semiconductor wafer along the dicing line area and each of the wiring substrates along the center portion to separate the semiconductor chips from one another, each of the semiconductor chips being with respective parts of associated two of the wiring substrates.

8. The method according to claim 7, wherein each of the semiconductor chips further includes fifth and sixth sides opposed to each other, a third set of electrode pads arranged along the fifth side and a fourth set of electrode pads arranged in the sixth side, and the method further comprises:

forming a plurality of additional wiring substrates separately from each other, each of the additional wiring substrates including seventh and eighth sides, a third set of external terminals arranged along the seventh side and a fourth set of external terminals arranged along the eighth side; and mounting the additional wiring substrates on the semiconductor wafer such that each of the additional wiring substrates is connected at the third set of external terminals thereof to the third set of electrode pads of the associated one of the semiconductor chips and at the fourth set of external terminals thereof to the fourth set of electrode pads of the adjacent semiconductor chip to the associated one of the semiconductor chips, each of the additional wiring substrates being at a center portion thereof over the dicing line area between the associated one of the semiconductor chips and the adjacent semiconductor chip, each of the additional wiring substrates being diced along the center portion thereof by dicing the semiconductor wafer so that each of the semiconductor chips is further with respective parts of associated two of the additional wiring substrates.

9. The method according to claim 7, wherein each of the wiring substrates includes an opening at the center portion so that the opening is positioned over the dicing line of the semiconductor wafer.

10. The method according to claim 7, wherein each of the respective parts of associated two of the wiring substrates is smaller than the semiconductor chip on which each of the respective parts of associated two of the wiring substrates is mounted.

11. The method according to claim 7, further comprising:
forming bump electrodes respectively onto electrode pads of the semiconductor chips; and
forming an under-fill layer over the semiconductor wafer with the bump electrodes,
the wiring substrates being mounted on the semiconductor wafer with an intervention of the under-fill layer.

12. The method as claimed in claim 11, wherein the under-fill layer is formed by using a printing method.

13. The method as claimed in claim 11, wherein the under-fill layer is formed by dropping an under-fill material over the semiconductor wafer.

14. A method of manufacturing a semiconductor device, comprising:

providing a first semiconductor chip, a second semiconductor chip being separated from the first semiconductor chip by a first dicing line, and a third semiconductor chip being separated from the second semiconductor chip by a second dicing line, the first semiconductor chip having a first electrode pad in the neighborhood of the first dicing line, the second semiconductor chip having a second electrode pad in the neighborhood of the first dicing line and a third electrode pad in the neighborhood of the second dicing line, and the third semiconductor chip having a fourth electrode pad in the neighborhood of the second dicing line;

providing a first substrate and a second substrate, the first substrate including a first external terminal on a first region and a second external terminal on a second region, and the second substrate including a third external terminal on a third region and a fourth external terminal on a fourth region;

mounting the first substrate on the first and second semiconductor chips so that the first substrate overlaps the first dicing line in plan view, the first and second external terminals of the first substrate being electrically connected to the first and second electrode pads of the first and second semiconductor chips, respectively;

mounting the second substrate on the second and third semiconductor chips so that the second substrate overlaps the second dicing line in plan view, the third and fourth external terminals of the substrate being electrically connected to the third and fourth electrode pads of the second semiconductor chips, respectively; and cutting the first to third semiconductor chips and the first and second substrates along the first and second dicing lines to separate the first, second, and third semiconductor chips.

15. The method according to claim 14, wherein the first substrate is smaller than the first and second semiconductor chips, and the second substrate is smaller than the second and third semiconductor chips.

16. The method according to claim 14, wherein
the first substrate includes a first opening that is disposed between the first and second regions so that the first opening is positioned over the first dicing line, and
the second substrate includes a second opening that is disposed between the third and fourth regions so that the second opening is positioned over the second dicing line.

17. The method according to claim 14, wherein
the first substrate includes a first cutting line that is disposed between the first and second regions so that the first cutting line is positioned over the first dicing line, and
the second substrate includes a second cutting line that is disposed between the third and fourth regions so that the second cutting line is positioned over the second dicing line.

* * * * *